(12) United States Patent
Hu et al.

(10) Patent No.: US 10,638,606 B2
(45) Date of Patent: Apr. 28, 2020

(54) COMPOSITE CIRCUIT BOARD

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Xian-Qin Hu, Qinhuangdao (CN); Mei Yang, Qinhuangdao (CN); Cheng-Jia Li, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/170,559

(22) Filed: Oct. 25, 2018

(65) Prior Publication Data

US 2019/0069406 A1    Feb. 28, 2019

Related U.S. Application Data

(62) Division of application No. 15/581,947, filed on Apr. 28, 2017, now Pat. No. 10,159,149.

(30) Foreign Application Priority Data

Dec. 29, 2016  (CN) .......................... 2016 1 1246904

(51) Int. Cl.
*H05K 1/11*     (2006.01)
*H05K 3/46*     (2006.01)
(Continued)

(52) U.S. Cl.
CPC .......... *H05K 1/115* (2013.01); *H05K 3/0023* (2013.01); *H05K 3/18* (2013.01); *H05K 3/185* (2013.01); *H05K 3/4076* (2013.01); *H05K 3/429* (2013.01); *H05K 3/4644* (2013.01); *H05K 3/4661* (2013.01); *H05K 3/4691* (2013.01); *H05K 2201/096* (2013.01); *H05K 2203/0703* (2013.01)

(58) Field of Classification Search
CPC ........ H05K 1/11; H05K 1/115; H05K 3/0023; H05K 3/18; H05K 3/185; H05K 3/4076
USPC ....................................................... 174/262
See application file for complete search history.

(56) References Cited

U.S. PATENT DOCUMENTS

| 5,442,143 A | 8/1995 | Schmidt et al. |
| 2013/0092420 A1* | 4/2013 | Li .................. H05K 3/4697 174/251 |

* cited by examiner

*Primary Examiner* — Tremesha S Willis
(74) *Attorney, Agent, or Firm* — ScienBiziP, P.C.

(57) ABSTRACT

A composite circuit board includes an insulation layer, an inner circuit layer, a first conductive layer and a second conductive layer embedded in the insulation layer, a third conductive layer and a fourth conductive layer formed on opposite surfaces of the insulation layer. The third conductive layer electrically connects with the first conductive layer. The fourth conductive layer electrically connects with the second conductive layer. The inner circuit layer is in a middle portion of the insulation layer. The first conductive layer and the second conductive layer respectively forms on opposite sides of the inner circuit layer. The insulation layer forms a plurality of first through holes between the first conductive layer and the inner circuit layer, a plurality of second through holes between the second conductive layer and the inner circuit layer.

6 Claims, 7 Drawing Sheets

(51) Int. Cl.
*H05K 3/18* (2006.01)
*H05K 3/00* (2006.01)
*H05K 3/40* (2006.01)
*H05K 3/42* (2006.01)

COMPOSITE CIRCUIT BOARD

CROSS-REFERENCE TO RELATED APPLICATIONS

This is a divisional application of patent application Ser. No. 15/581,947, filed on, Apr. 28, 2017, assigned to the same assignee, which is based on and claims priority to China Patent Application No. 201611246904.8 filed on Dec. 29, 2016, the contents of which are incorporated by reference herein.

FIELD

The subject matter herein generally relates to a circuit board, especially relates to a composite circuit board and manufacturing the same.

BACKGROUND

In order to satisfy the functional diversification development of various kinds of electronic equipment, the composite circuit board has been widely used, because of their light, higher line density, etc.

Generally, the composite circuit board is formed by forming or bonding a flexible circuit board and a rigid circuit board together. The composite circuit board has many advantages of both the flexible circuit board and the rigid circuit board. In the process of the composite circuit board, the flexible circuit board is needed to plate copper thereon, second opening on local area of the composite circuit board to form a plurality of holes to expose of the flexible circuit board. However, plating copper always makes the flexible circuit board warp. Furthermore, opening to form holes on the flexible circuit board always may make the composite circuit board have bad electrical conductivity.

BRIEF DESCRIPTION OF THE DRAWINGS

Implementations of the present disclosure will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

Figure 1:
FIGS. 1-20 show a method of manufacturing a composite circuit board of the present disclosure.

A method of manufacturing the composite circuit board includes the following steps:

Firstly, referring to FIG. 1, providing a first plate 10.

The first plate 10 has a long strip shape. The first plate 10 is made of copper.

Figure 2:
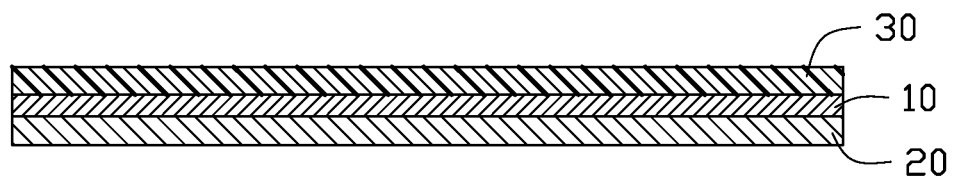

Secondly, referring to FIG. 2, forming a first photosensitive resin layer 20 and a bearing layer 30 on opposite surfaces of the first plate 10.

Figure 3:
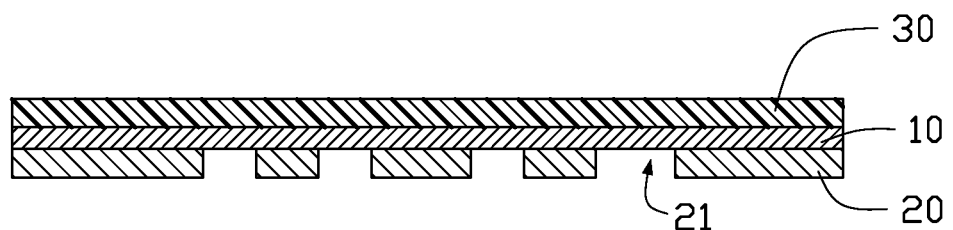

Thirdly, referring to FIG. 3, patterning the first photosensitive resin layer 20 to form a plurality of first gaps 21 by exposure imaging.

Figure 4:
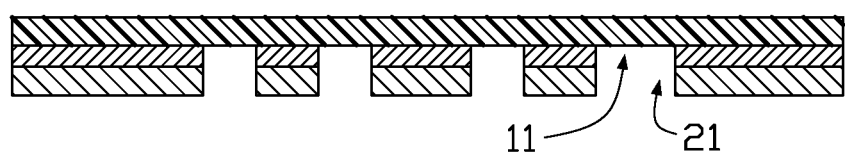

Referring to FIG. 4, etching a portion of the first plate 10 that is exposed from the plurality of first gaps 21 to form a plurality of spacing 11 on the first plate 10, thus, the first plate 10 is manufactured to be an inner circuit layer 10a.

A depth of the plurality of spacing 11 is equal to a thickness of the first plate 10. The plurality of the spacing 11 corresponds to and superimposes the plurality of the first gaps 21. A bore diameter of the spacing 11 is equal to a bore diameter of the gap 21.

Figure 5:
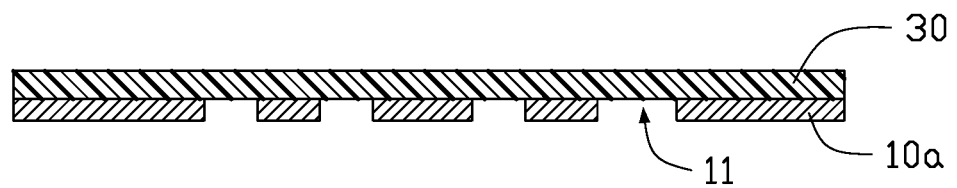

Referring to FIG. 5, removing the first photosensitive resin layer 20 from the inner circuit layer 10a.

Figure 6:
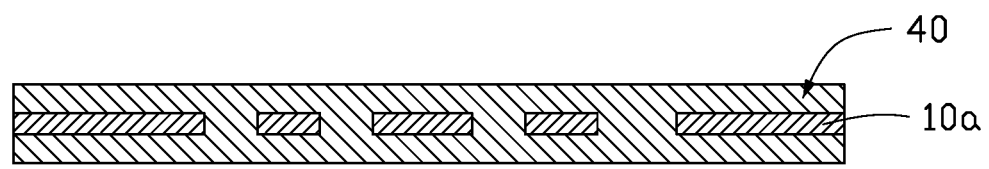

Referring to FIG. 6, forming a second photosensitive resin layer 40 on a surface of the inner circuit layer 10a, then removing the bearing layer 30 on another surface of the inner circuit layer 10a and further forming the second photosensitive resin layer 40 on another surface of the inner circuit layer 10a.

Figure 7:
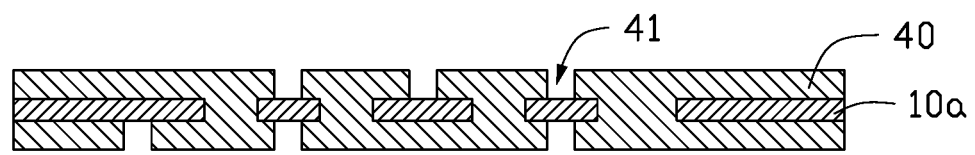

Referring to FIG. 7, patterning the second photosensitive resin layer 40 to form a plurality of second gaps 41 by exposure imaging, at the same time, curing the second photosensitive resin layer 40.

Figure 8:
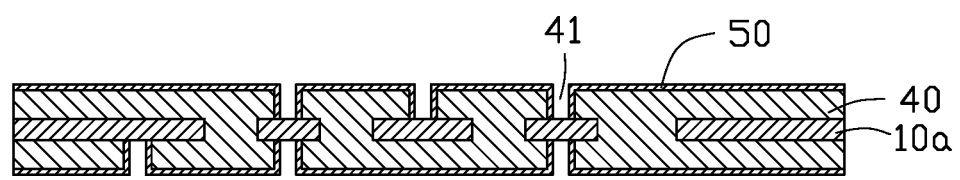

Referring to FIG. 8, forming a first seed layer 50 on a surface of the second photosensitive resin layer 40.

The first seed layer 50 is formed by electroless plating or sputtering. The first seed layer 50 further forms on the surface of the second photosensitive resin layer 40 and the surface around the plurality of the second gaps 41. While plating the first seed layer 50, the inner circuit layer 10a is exposed from the plurality of the second gaps 41.

Figure 9:
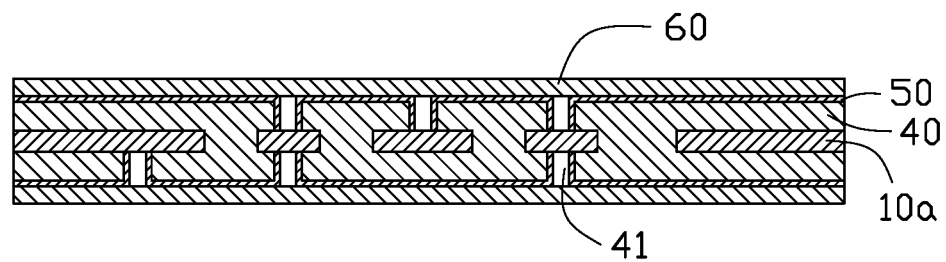

Referring to FIG. 9, forming a third photosensitive resin layer 60 on the surface of the first seed layer 50.

The third photosensitive resin layer 60 is spaced from the inner circuit layer 10a by the plurality of the second gaps 41.

Figure 10:
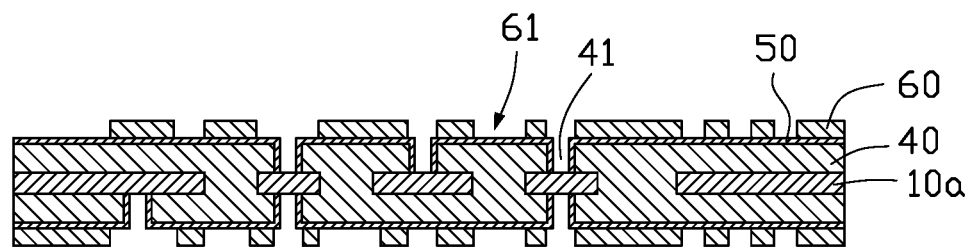

Referring to FIG. 10, patterning the third photosensitive resin layer 60 to form a plurality of third gaps 61 through the way of exposure imaging.

The third gaps 61 corresponding to the second gaps 41 are in air communication with the corresponding second gaps 41.

Figure 11:
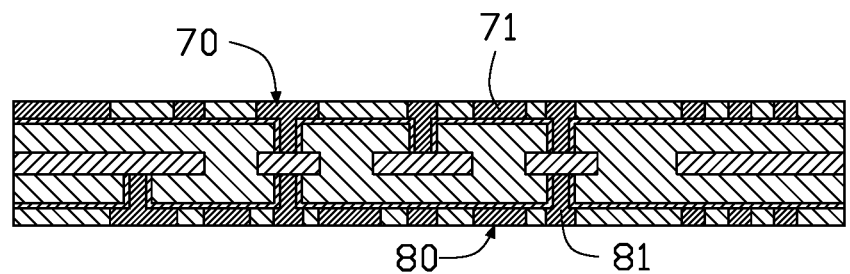

Referring to FIG. 11, plating copper in the plurality of the third gaps 61 and the plurality of second gaps 41 to form a first conductive layer 70 and a second conductive layer 80.

The first conductive layer 70 includes a plurality of first conductive portions 71 spaced from each other. The second conductive layer 80 includes a plurality of second conductive portions 81 spaced from each other.

Figure 12:
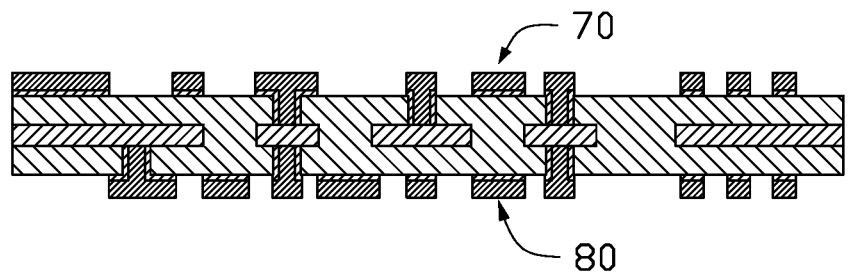

Referring to FIG. 12, removing the remainder third photosensitive resin layer 60 and the first seed layer 50 correspondingly to the remainder photosensitive resin layer 60.

Figure 13:
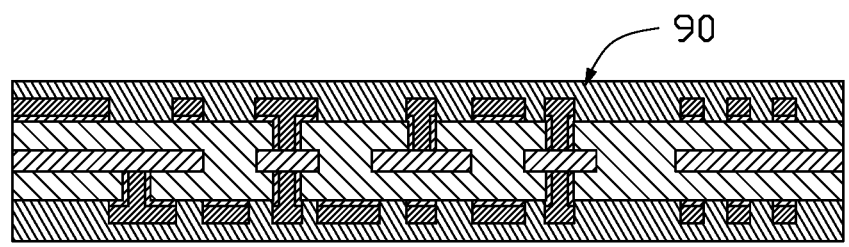

Referring to FIG. 13, forming a fourth photosensitive resin layer 90 on the first conductive layer 70 and the second conductive layer 80.

The fourth photosensitive resin layer 90 covers the first conductive layer 70 and the second conductive layer 80.

Figure 14:
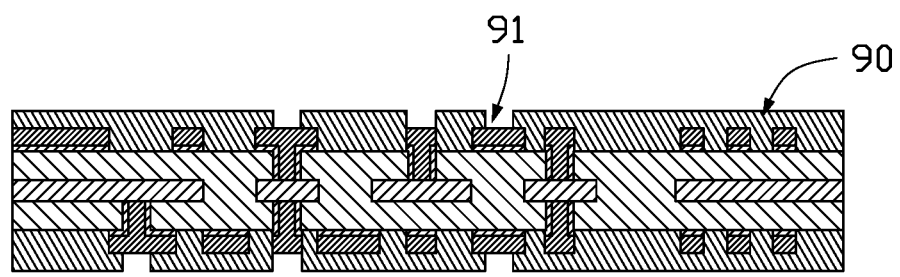

Referring to FIG. 14, patterning the fourth photosensitive resin layer 90 to form a plurality of fourth gaps 91 through the way of exposure imaging, at the same time curing the fourth photosensitive resin layer 90.

Figure 15:
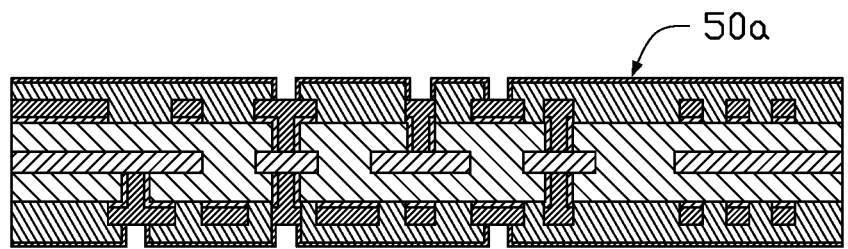

Referring to FIG. 15, forming a second seed layer 50a on a surface of the fourth photosensitive resin layer 90.

The second seed layer 50a is formed by electroless plating or sputtering. The second seed layer 50a further forms on the surface of the fourth photosensitive resin layer 90 and the surface around the plurality of the fourth gaps 91.

Figure 16:
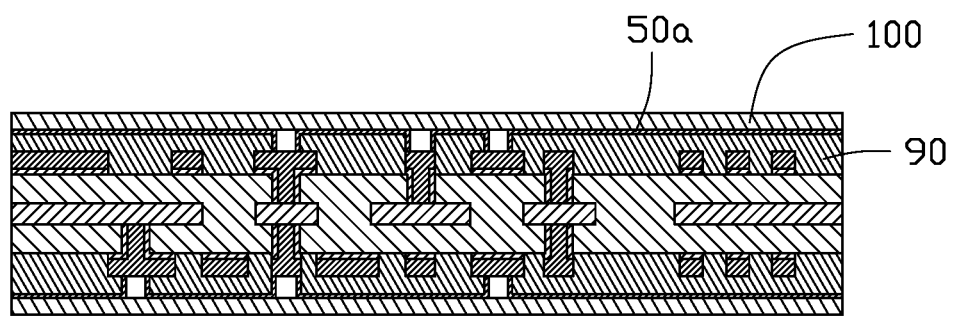

Referring to FIG. 16, forming a fifth photosensitive resin layer 100 on a surface of the fourth photosensitive resin layer 90.

Figure 17:
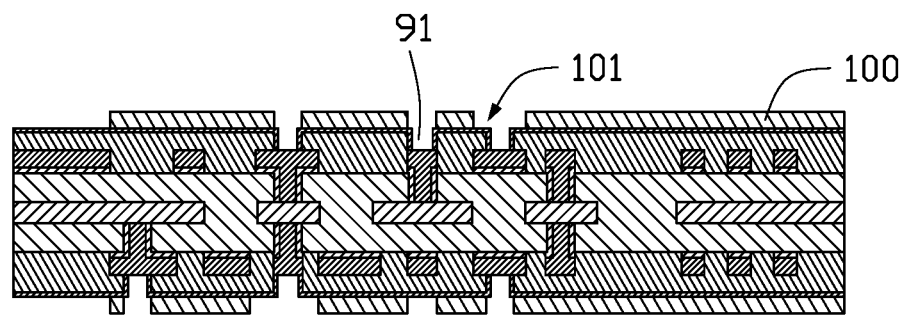

Referring to FIG. 17, patterning the fifth photosensitive resin layer 100 to form a plurality of fifth gaps 101.

The fifth gaps 101 corresponding to the fourth gaps 91 are in air communication with the fourth gaps 91.

Figure 18:
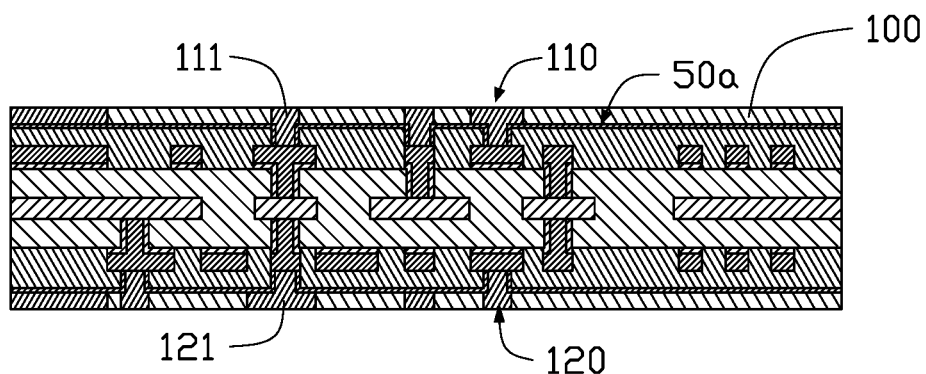

Referring to FIG. 18, plating copper in the plurality of fifth gaps 101 and the fourth gaps 91 to respectively form a third conductive layer 110 and a fourth conductive layer 120.

The third conductive layer 110 includes a plurality of third conductive portions 111 spaced from each other. The fourth conductive layer 120 includes a plurality of fourth conductive portions 121 spaced from each other.

Figure 19:
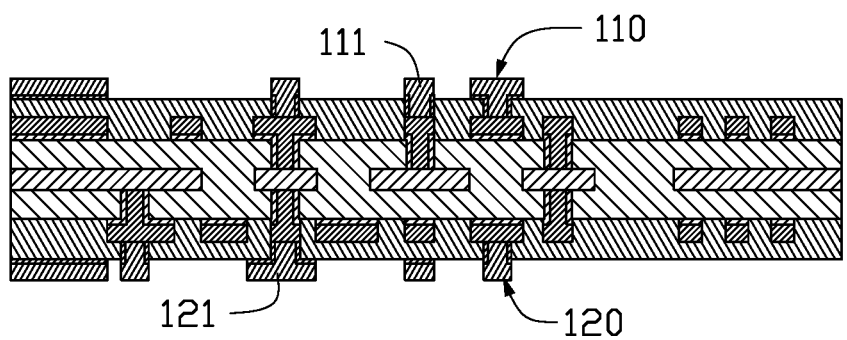

Referring to FIG. 19, removing the remainder fifth photosensitive resin layer 100 and the second seed layer 50a corresponding to the remainder fifth photosensitive resin layer 100.

Figure 20:
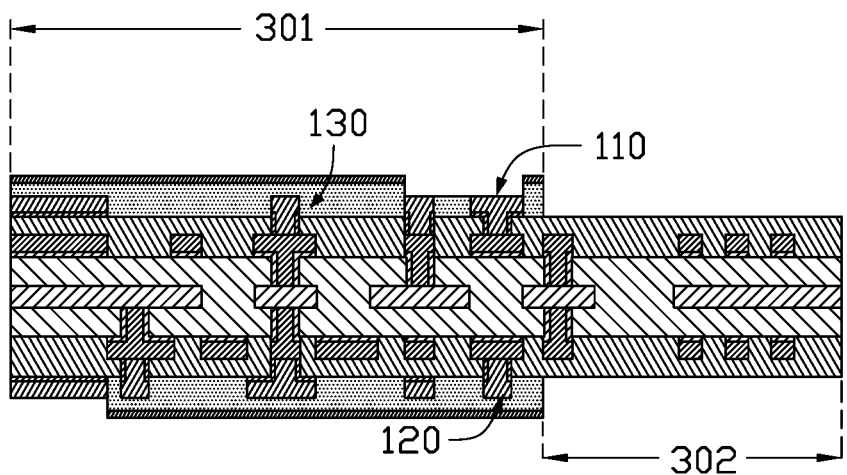

Referring to FIG. 20, filling an insulation colloid on an outer surface of the third conductive layer 110 and the fourth conductive layer 120, and curing the insulation colloid to form an encapsulation layer 130.

The encapsulation layer 130 covers the third conductive layer 110 and the fourth conductive layer 120. An area of the composite circuit board covered with the encapsulation layer 130 defines a rigid area 301, another area of the composite circuit board defines a flexible area 302.

In above method of manufacturing the composite circuit board, the plurality of the first gaps 21, second gaps 41, third gaps 61, fourth gaps 91 and fifth gaps 101 are formed by exposure imaging rather than by mechanical drilling. Thus, the method of manufacturing the composite circuit board has high production efficiency, and the composite circuit board has good quality. Further, between the first conductive layer 70, and the second conductive layer 80 are connected by photosensitive resin layer. Between the third conductive layer 110 and the fourth conductive layer 120 are connected by photosensitive resin layer. Thus, the composite circuit board is thin and light.

Figure 21:
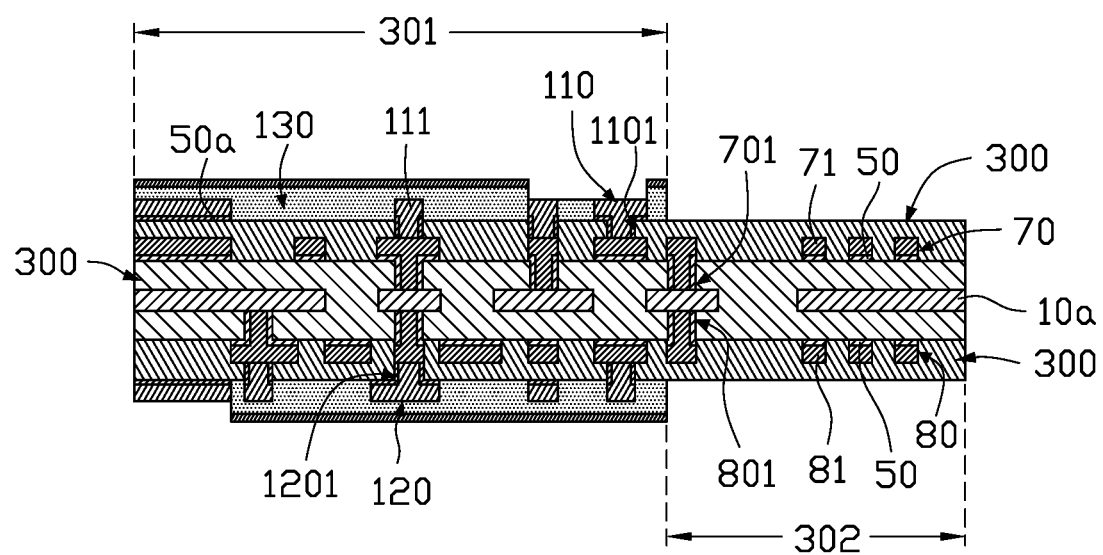
FIG. 21 is a cross-sectional view of the composite circuit board manufactured by the method in FIGS. 1-20.

As illustrated in FIG. 21, the composite circuit board manufactured from the method mentioned above includes an insulation layer 300, an inner circuit layer 10a, a first conductive layer 70, a second conductive layer 80 embedded in the insulation layer 300, the third conductive layer 110 and the fourth conductive layer 120 formed on opposite surfaces of the insulation layer 300.

The insulation layer 300 is made of photosensitive resin. The inner circuit layer 10a is in a middle portion of the insulation layer 300. The inner circuit layer 10a is made of conductive metal. In the exemplary embodiment, the inner circuit layer 10a is made of copper.

The first conductive layer 70 includes a plurality of first conductive portions 71 spaced from each other. The second conductive layer 80 includes a plurality of second conductive portions 81 spaced from each other. The first conductive layer 70 and the second conductive layer 80 respectively located on opposite sides of the inner circuit layer 10a. The first conductive layer 70 and the second conductive layer 80 are spaced from the inner circuit layer 10a. A first seed layer 50 is formed between the first conductive layer 70 and the insulation layer 300, the second conductive layer 80 and the insulation layer 300. A thickness of the first seed layer 50 is less than a thickness of the inner circuit layer 10a, the first conductive layer 70 and the second conductive layer 80. The first seed layer 50 increases a connection between the first conductive layer 70 and the insulation 300. The first seed layer 50 also increases a connection between the second conductive layer 80 and the insulation layer 300.

The insulation layer 300 forms a plurality of first through holes 701 between the first conductive layer 70 and the inner circuit layer 10a. The first seed layer 50 also formed on an inner surface of the first through holes 701. The first conductive layer 70 extends toward the inner circuit layer 10a through the plurality of the first through holes 701 to connect with the inner circuit layer 10a.

The insulation layer 300 also forms a plurality of second through holes 801 between the second conductive layer 80 and the inner circuit layer 10a. The first seed layer 50 also formed on an inner surface of the second through holes 801. The second conductive layer 80 extends toward the inner circuit layer 10a through the plurality of second through holes 801 to connect with the inner circuit layer 10a.

The third conductive layer 110 includes a plurality of third conductive portions 111 spaced from each other. The fourth conductive layer 120 includes a plurality of fourth conductive portions 121 spaced from each other. The third conductive layer 110 is on a surface close to the first conductive layer 70. The fourth conductive layer 120 is on another surface close to the second conductive layer 80. A second seed layer 50a is formed between the third conductive layer 110 and the insulation layer 300, and the second seed layer 50a is formed between the fourth conductive layer 120 and the insulation layer 300. The second seed layer 50a increases a connection between the third conductive layer 110, and the second seed layer 50a increase a connection between the fourth connection layer 120 and the insulation layer 300.

Further, the insulation layer 300 forms a plurality of third through holes 1101. The plurality of third through holes 1101 is between the third conductive layer 110 and the first conductive layer 70. The second seed layer 50a forms on an inner surface of the third through holes 1101. The third conductive layer 110 extends toward the first conductive layer 70 through the plurality of third through holes 1101 to connect with the first conductive layer 70.

The insulation layer 300 forms a plurality of fourth through holes 1201. The plurality of fourth through holes 1201 locates between the fourth conductive layer 120 and the second conductive layer 80. The second seed layer 50a forms on an inner surface of the fourth through holes 1201. The fourth conductive layer 120 extends toward the second conductive layer 80 through the plurality of fourth through holes 1201 to connect with the second connective layer 80.

The first through holes 701, the second through holes 801, the third through holes 1101 and the fourth through holes 1201 are cylindrical. An axis of the first through holes 701, an axis of the second through holes 801, an axis of the third through holes 1101 and an axis of the fourth through holes 1201 are all perpendicular to the insulation layer 300, the inner circuit layer 10a, the first conductive layer 70, the second conductive layer 80, the third conductive layer 110 and the fourth conductive layer 120.

The composite circuit board also includes an encapsulation layer 130. The encapsulation layer 130 formed on an outer surface of the insulation layer 300 and covers the third conductive layer 110 and fourth conductive layer 120. The encapsulation layer 130 is made of insulation colloid. An area of the composite circuit board covered with the encapsulation layer 130 defines a rigid area 301, another area of the composite circuit board defines a flexible area 302.

In the illustrated embodiment, the first conductive layer 70, the second conductive layer 80, the third conductive layer 110 and the fourth conductive layer 120 are insulated through the insulation layer 300. Thus, the composite circuit board is thin and light. Also, the first through holes 701, the second through holes 801, the third through holes 1101 and the fourth through holes 1201 are formed through the way of exposure imaging. Thus, the composite circuit board has good quality.

The embodiments shown and described above are only examples. Many details are often found in the art such as the other features of a composite circuit board and method of manufacturing the same. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. A composite circuit board, comprising:
   an insulation layer;
   an inner circuit layer embedded and encased in the insulation layer, and comprising at least one spacer fully filled with the insulation layer;
   a first conductive layer and a second conductive layer formed on opposite surfaces of the insulation layer;
   a third conductive layer and a fourth conductive layer formed on opposite surfaces of the insulation layer;
   the third conductive layer electrically connecting with the first conductive layer, the fourth conductive layer electrically connecting with the second conductive layer;
   wherein, the inner circuit layer is in a middle portion of the insulation layer, the first conductive layer and the second conductive layer respectively located on opposite sides of the inner circuit layer, the insulation layer forms a plurality of first through holes between the first conductive layer and the inner circuit layer, a plurality of second through holes between the second conductive layer and the inner circuit layer, the first conductive layer extends toward the inner circuit layer through the plurality of first through holes to connect with the inner circuit layer, the second conductive layer extends toward the inner circuit layer through the plurality of second through holes to connect with the inner circuit layer, the insulation layer is made of photosensitive resin, a first seed layer is plated between a side of the first conductive layer facing the second conductive layer and the insulating layer, and between a side of the second conductive layer facing the first conductive layer and the insulating layer, the first seed layer is further formed on a surface around the plurality of first through holes and a surface around the plurality of second through holes, the composite circuit board further comprises an encapsulation layer, the encapsulation layer forms on an outer surface of the insulation layer and covers the third conductive layer and fourth conductive layer.

2. The composite circuit board of claim 1, wherein the first conductive layer comprises a plurality of first conductive portions spaced from each other, the second conductive layer comprises a plurality of second conductive portions spaced from each other.

3. The composite circuit board of claim 2, wherein a thickness of the first seed layer is less than a thickness of the inner circuit layer, the first conductive layer and the second conductive layer.

4. The composite circuit board of claim 1, wherein the third conductive layer is on a surface close to the first conductive layer, the fourth conductive layer is on another surface close to the second conductive layer, the third conductive layer comprises a plurality of third conductive portions spaced from each other, the fourth conductive layer comprises a plurality of fourth conductive portions spaced from each other.

5. The composite circuit board of claim 4, wherein, a plurality of third through holes are formed above the insulation layer, a plurality of fourth through holes are formed below the insulation layer, the plurality of third through holes is between the third conductive layer and the first conductive layer, the plurality of fourth through holes is between the fourth conductive layer and the second conductive layer, the third conductive layer extends toward the first conductive layer through the plurality of third through holes to connect with the first conductive layer, the fourth conductive layer extends toward the second conductive layer through the plurality of fourth through holes to connect with the second connective layer, a second seed layer is between the third conductive layer and the insulation layer, the fourth conductive layer and the insulation layer, the second seed layer forms on the surface around the third through holes and the fourth through holes.

6. The composite circuit board of claim 5, wherein an axis of the first through holes, an axis of the second through holes, an axis of the third through holes and an axis of the fourth through holes are perpendicular to the insulation layer, the inner circuit layer, the first conductive layer, the second conductive layer, the third conductive layer and the fourth conductive layer.

* * * * *